United States Patent
Lewis et al.

(10) Patent No.: US 7,169,483 B2
(45) Date of Patent: Jan. 30, 2007

(54) OPTO-ELECTROACTIVE DEVICE COMPRISING A METALLOCENE AND METHOD

(75) Inventors: Larry Neil Lewis, Scotia, NY (US); Joseph John Shiang, Niskayuna, NY (US); Aharon Yakimov, Niskayuna, NY (US); Gautam Parthasarathy, Saratoga Springs, NY (US); Jie Liu, Niskayuna, NY (US); Sergei Kniajanski, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 155 days.

(21) Appl. No.: 10/822,446

(22) Filed: Apr. 12, 2004

(65) Prior Publication Data

US 2005/0227108 A1  Oct. 13, 2005

(51) Int. Cl.
*H05B 33/14* (2006.01)
*H01L 31/00* (2006.01)

(52) U.S. Cl. .................. 428/690; 428/917; 427/66; 427/74; 257/40; 313/504; 313/506; 556/53

(58) Field of Classification Search ................ 428/690, 428/917; 136/263; 257/40; 313/504, 506; 427/66, 74; 430/84; 556/53
See application file for complete search history.

(56) References Cited

U.S. PATENT DOCUMENTS 3,711,280 A    1/1973  Johnson ................... 430/74

(Continued)

FOREIGN PATENT DOCUMENTS

DE           19726842          1/1998

(Continued)

OTHER PUBLICATIONS

A. Kraft, A.C. Grimsdale, A.B. Holmes, "Electroluminescent Conjugated Polymers-Seeing Polymers in a New Light," Angew. Chem. Int. Ed 37 (1998) 403.

(Continued)

*Primary Examiner*—Rena Dye
*Assistant Examiner*—Camie S. Thompson

(74) *Attorney, Agent, or Firm*—Mary Louise Gioeni; William E. Powell, III

(57) ABSTRACT

Disclosed is an opto-electroactive device comprising a metallocene of the formula

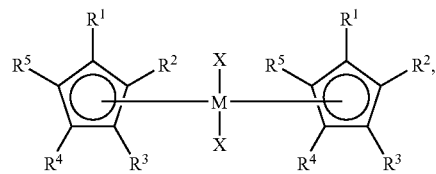

wherein M is zirconium or hafnium; X is halogen and $R^1$–$R^5$ are each independently hydrogen, aryl, alkyl, halogen or —$Si(R^6)_3$; or wherein at least two adjacent R substituents on at least one ring are joined to form a fused ring, which may be unsubstituted or substituted with aryl, alkyl, halogen or —$Si(R^6)_3$; or wherein the $R^1$ substituents on each ring are joined to link the rings in an ansa bridge, and wherein $R^6$ is an alkyl group, a substituted alkyl group, an aryl group or a substituted aryl group. Also disclosed is a method for making an opto-electroactive device comprising a metallocene.

24 Claims, 7 Drawing Sheets

U.S. PATENT DOCUMENTS

| | | | | |
|---|---|---|---|---|
| 3,765,883 | A | * | 10/1973 | Endo et al. .................. 430/80 |
| 6,645,645 | B1 | | 11/2003 | Adachi et al. .............. 428/690 |
| 6,646,373 | B1 | * | 11/2003 | Su ............................. 313/512 |
| 6,846,565 | B2 | * | 1/2005 | Korgel et al. ............... 428/402 |
| 2002/0037427 | A1 | | 3/2002 | Toshiki ....................... 428/690 |
| 2004/0058453 | A1 | * | 3/2004 | Free et al. .................. 436/183 |

FOREIGN PATENT DOCUMENTS

WO      03065841      8/2003

OTHER PUBLICATIONS

M.T. Bernius, M. Inbasekaran, J. O'Brien, W. Wu, "Progress with Light-Emitting Polymers," Adv. Mater., 12, (2000) 1737.

J.C. Scott, "Conducting Polymers: From Novel Science to New technology," Science, 278, (1997) 2071.

J.E. Pickett, "Polymer photodegradation and stabilization: a tutorial," Polymer Preprints, American Chemical Society, Division of Polymer Chemistry, (2001), 42 344.

M.E. Thompson, S. Lamansky, P. Djurovich, D. Murphy, F. Abdel-Razzaq, S.R. Forrest M. Baldo, P.E. Burrow, "Electrophosphorescent organic light emitting diodes," PolymericMaterials Science and Engineering, 83 (2000), 202.

M. A. Baldo, M.E. Thompson, S.R. Forrest, "Phosphorescent materials for application to organic light omitting devices," Pure and Applied Chemistry, 71 (1999) 2095.

V. W-W Yam, C-K. Hui, K. M-C. Wang, N Zhu, K-K. Cheung, "Synthesis, Structural Characterization and Luminescence Behavior of Face-to-Face Diplatinum (II) Alkynyl~Complexes," Organometallics, 21(2002) 4326.

G.V. Loukova, V.A. Smirnov, "Phosphorescent ligand-to-metal charge-transfer excited states in the group IVb metallocene triad", Chem Phys. Lett., 329 (2000) 437-442.

G.V. Loukova, V.V. Strelets, "Electrochemical versus optical insight in frontier orbitals of Ti(IV), Zr(IV), and Hf(IV) bent metallocenes,", J. Organomet. Chem.,, 606 (2000) 203-206.

J.W.Kenney, D.R.Boone, D .Striplin, Yong-Hong Chen, and Kyle B. Hamar, "Electronic Luminescence Spectra of Charge Transfer States of Titanium (IV) Metallocene," Organometallics, 12 (1993) 3671-3676.

A. Vogler, H. Kunkely, "Electronic spectra and photoreactivity of cyclopentadienyl complexes," Coordination Chemistry Reviews, 211 (2001) 223.

G.V. Loukova, "The first experimental approach to probing frontier orbitals and HOMO-LUMO gap in bent metallocenes," Chemical Physics Letters, 353 (2002) 244-252.

P.M. Druce, B.M. Kingston, M.F. Lappert, T.R. Spalding, R.C. Srivastava, "Metallocene halides. I. Synthesis, spectra, and redistribution equilibriums of di-p-cyclopentadienyldihalotitaniim (IV),-zirconium(IV), and -hafnium(IV)" J. Chem. Soc. (A) (1969) 2106.

A. Herzog, F-Q Liu, H.W. Roesky, . Demsar, K. Keller, M. Noltemeyer, "Trimethyltin Fluoride: A New Fluorinating Reagent for the Preparation of Organometallic Fluorides," Organometallics, 13, (1994) 1251.

M. Braun, "a-Heteroatom-Substituted 1-Alkenyllithium Reagents: Carbanions and Carbenoids for C—C Bond Formation," Angew. Chem. Int. Ed 37 (1998) 431.

* cited by examiner

OPTO-ELECTROACTIVE DEVICE COMPRISING A METALLOCENE AND METHOD

BACKGROUND OF THE INVENTION

The present invention relates to an opto-electroactive device comprising a metallocene. More particularly, the present invention relates to an opto-electroactive device comprising a metallocene of the general formula $(\eta^5\text{-}C_5R_5)_2MX_2$, wherein M is zirconium or hafnium.

Common examples of opto-electroactive devices include electroluminescent devices, OLEDs, photovoltaic devices, and the like. In many examples opto-electroactive devices comprise a light-emitting or light-absorbing layer. In other examples opto-electroactive devices comprise a hole-blocking layer. A hole blocking layer usually comprises a material, typically an electron transporting material, that is effective in blocking transport of holes through the said layer, thus increasing the possibility of electron-hole recombination as well as confining recombination within desirable layers. An effective hole blocking material is one for which the ionization potential of the material is at least slightly larger than the ionization potential of the adjacent emissive layer. In a particular example the hole blocking material has an ionization potential at least about 0.1 eV larger than the ionization potential of the adjacent emissive layer. Such materials of the hole blocking layer also preferably have high electron transporting properties, such as a high electron mobility. Despite recent advances in materials for use as light-emitting layers, light-absorbing layers or hole-blocking layers, there is a continuing need to find new and improved materials to be used as such components in opto-electroactive devices.

BRIEF DESCRIPTION OF THE INVENTION

The present inventors have discovered novel opto-electroactive devices which comprise a metallocene. In various embodiments a metallocene of the invention may function as a light-emitting layer or as a light-absorbing layer or as a hole-blocking layer in an opto-electroactive device. In a particular embodiment the present invention comprises an opto-electroactive device comprising a metallocene of the formula

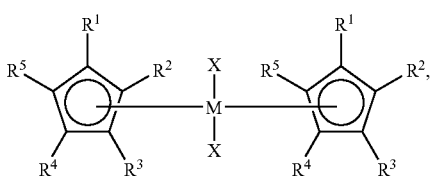

wherein M is zirconium or hafnium; X is halogen and $R^1$–$R^5$ are each independently hydrogen, aryl, alkyl, halogen or $\text{—Si}(R^6)_3$; or wherein at least two adjacent R substituents on at least one ring are joined to form a fused ring, which may be unsubstituted or substituted with aryl, alkyl, halogen or $\text{—Si}(R^6)_3$; or wherein the $R^1$ substituents on each ring are joined to link the rings in an ansa bridge, and wherein $R^6$ is an alkyl group, a substituted alkyl group, an aryl group or a substituted aryl group. In another particular embodiment the present invention comprises a method for making an opto-electroactive device comprising a metallocene.

Various other features, aspects, and advantages of the present invention will become more apparent with reference to the following description and appended claims.

DETAILED DESCRIPTION OF THE INVENTION

Figure 1:
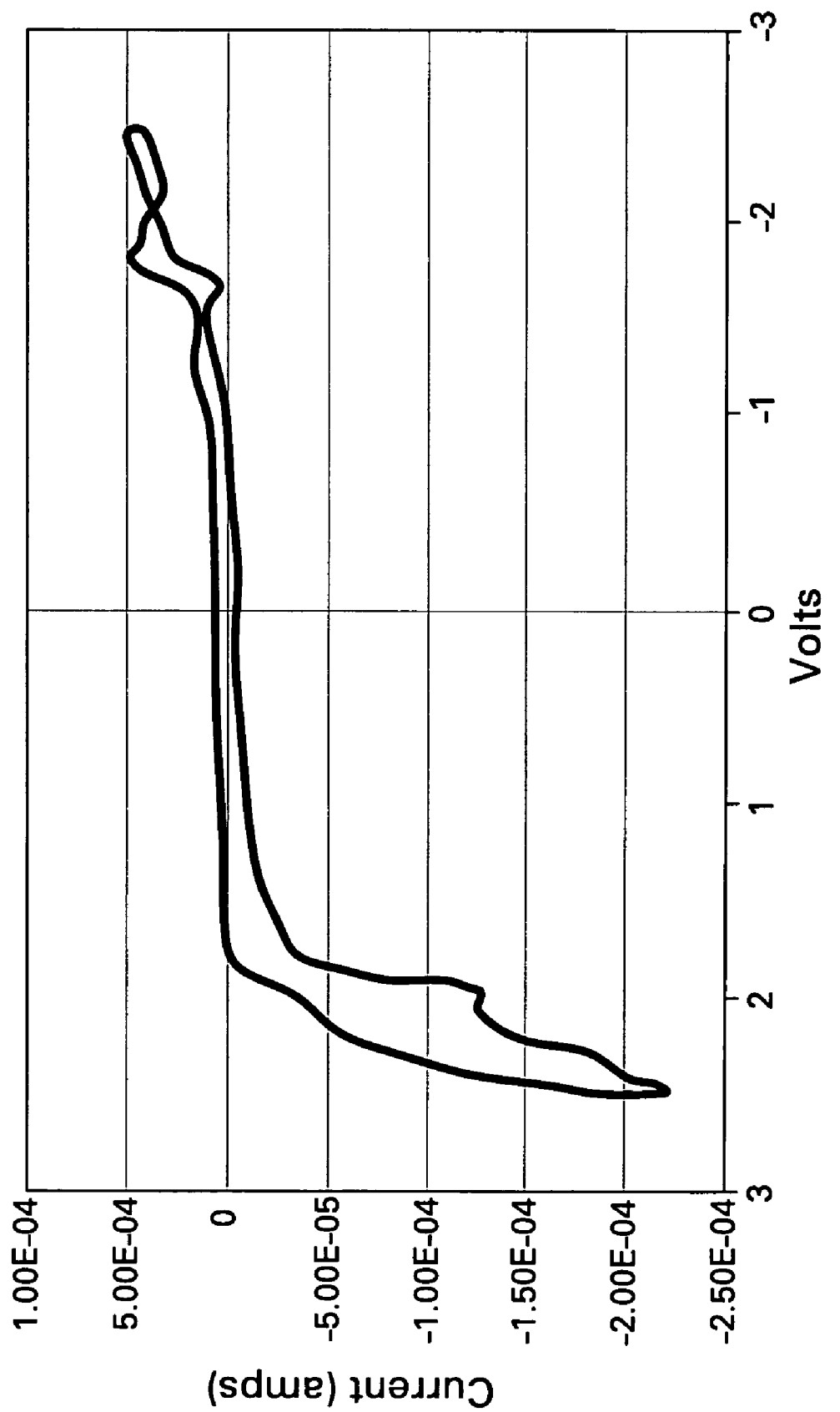
FIG. 1 shows cyclic voltammetry measurements for the compound $Cp_2ZrCl_2$ in acetonitrile comprising 0.1 molar tetrabutylammonium perchlorate.

In the following specification and the claims which follow, reference will be made to a number of terms which shall be defined to have the following meanings. The singular forms "a", "an" and "the" include plural referents unless the context clearly dictates otherwise. "Optional" or "optionally" means that the subsequently described event or circumstance may or may not occur, and that the description includes instances where the event occurs and instances where it does not. The term "opto-electroactive" as used herein refers to a material that is (1) capable of transporting, blocking or storing charge (either plus charge or minus charge), (2) luminescent, fluorescent, phosphorescent or a combination of fluorescent and phosphorescent, and/or (3) useful in photo-induced charge generation. An "opto-electroactive device" is a device comprising an opto-electroactive material.

Metallocenes suitable for use in an opto-electroactive device of the present invention comprise Group 4 metal dihalides containing substituted or unsubstituted cyclopentadienyl ligands of the general formula $(\eta^5\text{-}C_5R_5)_2MX_2$, wherein M is zirconium or hafnium. In particular embodiments suitable metallocenes comprise those with the structure of formula (I):

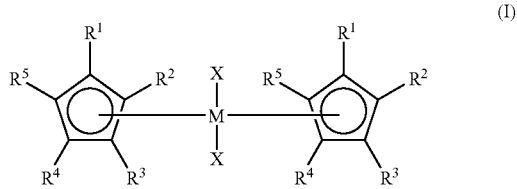

wherein M is zirconium or hafnium; X is halogen and $R^1$–$R^5$ are each independently hydrogen, aryl, alkyl, halogen or —Si($R^6$)$_3$ wherein $R^6$ is an alkyl group, a substituted alkyl group, an aryl group or a substituted aryl group. In other particular embodiments at least two adjacent R substituents on each cyclopentadienyl ring are joined to form a ring, thus providing fused rings coordinated to the zirconium or hafnium atom, illustrative examples of which include indenyl, tetrahydroindenyl, and fluorenyl which each independently may be unsubstituted or substituted with aryl, alkyl, halogen or —Si($R^6$)$_3$ substituents wherein $R^6$ is an alkyl group, a substituted alkyl group, an aryl group or a substituted aryl group. Thus, although the term "cyclopentadienyl" is used to describe the ring structure in formula (I), it should be understood that ring structures wherein a cyclopentadienyl ring is fused to another aromatic or aliphatic ring are also within the scope of the invention. In still other particular embodiments the $R^1$ substituents on each cyclopentadienyl ring are joined to link two cyclopentadienyl rings via a bridging ansa group, in which embodiment an illustrative example the bridging ansa group is -E($R^6$)$_2$ wherein E is carbon, silicon, or germanium, and $R^6$ is an alkyl group, a substituted alkyl group, an aryl group or a substituted aryl group. In particular embodiments E is silicon. It should also be understood that both symmetrical and unsymmetrical metallocenes are within the scope of the invention. Illustrative examples of unsymmetrical metallocenes include, but are not limited to, a metallocene with one substituted and one unsubstituted cyclopentadienyl ring and a metallocene with one cyclopentadienyl ring and one fluorene ring. In other particular embodiments X is fluoro, chloro or bromo. In still other particular embodiments $R^1$–$R^5$ are each hydrogen.

The term "alkyl" as used in the various embodiments of the present invention is intended to designate linear alkyl, branched alkyl, aralkyl, cycloalkyl, bicycloalkyl, tricycloalkyl and polycycloalkyl radicals containing carbon and hydrogen atoms, and optionally containing atoms in addition to carbon and hydrogen, for example atoms selected from Groups 15, 16 and 17 of the Periodic Table. Alkyl groups may be saturated or unsaturated, and may comprise, for example, vinyl or allyl. The term "alkyl" also encompasses that alkyl portion of alkoxide groups. In various embodiments normal and branched alkyl radicals are those containing from 1 to about 32 carbon atoms, and include as illustrative non-limiting examples $C_1$–$C_{32}$ alkyl optionally substituted with one or more groups selected from $C_1$–$C_{32}$ alkyl, $C_3$–$C_{15}$ cycloalkyl or aryl; and $C_3$–$C_{15}$ cycloalkyl optionally substituted with one or more groups selected from $C_1$–$C_{32}$ alkyl. Some particular illustrative examples comprise methyl, ethyl, n-propyl, isopropyl, n-butyl, sec-butyl, tertiary-butyl, pentyl, neopentyl, hexyl, heptyl, octyl, nonyl, decyl, undecyl and dodecyl. Some illustrative non-limiting examples of cycloalkyl and bicycloalkyl radicals include cyclobutyl, cyclopentyl, cyclohexyl, methylcyclohexyl, cycloheptyl, bicycloheptyl and adamantyl. In various embodiments aralkyl radicals are those containing from 7 to about 14 carbon atoms; these include, but are not limited to, benzyl, phenylbutyl, phenylpropyl, and phenylethyl. The term "aryl" as used in the various embodiments of the present invention is intended to designate substituted or unsubstituted aryl or heteroaryl radicals containing from 6 to 18 ring carbon atoms. Some illustrative non-limiting examples of these aryl radicals include $C_6$–$C_{15}$ aryl optionally substituted with one or more groups selected from $C_1$–$C_{32}$ alkyl, $C_3$–$C_{15}$ cycloalkyl or aryl. Some particular illustrative examples of aryl radicals comprise substituted or unsubstituted phenyl, biphenyl, tolyl and naphthyl.

In some embodiments of the present invention a metallocene of the present invention may be employed in a hole blocking layer in an opto-electroactive device, such as in an electroluminescent device. In such embodiments wherein the metallocene is present in a hole-blocking layer, the opto-electroactive device typically comprises: (a) an anode; (b) a cathode; and (c) a hole-blocking layer comprising a metallocene of the present invention. In other embodiments wherein the metallocene is present in a hole-blocking layer, the opto-electroactive device typically comprises: (a) an anode; (b) a light-emitting layer; (c) a hole-blocking layer comprising a metallocene of the present invention; and (d) a cathode. In some specific embodiments the opto-electroactive device often comprises: (i) a substrate; (ii) an anode formed over the substrate; (iii) a layer of a conductive polymer or a hole transporter material formed over the anode; (iv) optionally an electron-blocking layer; (v) a layer of light-emitting material; (vi) a layer of a hole-blocking material comprising a metallocene of the present invention (vii) a layer of an electron transporter material; and (viii) a cathode formed over the layer of electron transporter material. In one particular embodiment the metallocene in said hole-blocking layer is a zirconocene.

In another embodiment a metallocene of the present invention may be employed in a light-emitting layer in an opto-electroactive device. In such embodiments the opto-electroactive device typically comprises: (a) an anode; (b) a cathode; and (c) a layer of light-emitting material comprising a metallocene of the present invention. In some specific embodiments the opto-electroactive device often comprises: (i) a substrate; (ii) an anode formed over the substrate; (iii) optionally a layer of a conductive polymer or a hole transporter material formed over the anode; (iv) optionally an electron-blocking layer; (v) a layer of light-emitting material comprising a metallocene of the present invention; (vi) optionally a layer comprising a hole-blocking material; (vii) optionally a layer comprising an electron transporter material; and (viii) a cathode. In such embodiments wherein the metallocene is present in a light-emitting layer, the opto-electroactive device typically emits light in the wavelength range of about 300 nm to about 1200 nm, or in the wavelength range of about 400 nm to about 800 nm, or in the wavelength range of about 400 nm to about 700 nm, or in the wavelength range of about 400 nm to about 650 nm, or in the wavelength range of about 400 nm to about 550 nm, or in the wavelength range of about 400 nm to about 500 nm. In one particular embodiment the metallocene in said layer of light-emitting material is a zirconocene. In another particular embodiment the opto-electroactive device comprises a zirconocene of the present invention which is phosphorescent.

In another embodiment a metallocene of the present invention may be employed in a light-absorbing layer in an opto-electroactive device. In such embodiments the opto-electroactive device typically comprises: (a) an anode; (b) a cathode; and (c) a layer of light-absorbing material comprising a metallocene of the present invention. In one particular embodiment the metallocene in said layer of light-absorbing material is a zirconocene.

Suitable cathode materials for opto-electroactive devices generally comprise those having a low work function value such that a relatively small voltage causes emission of electrons from the cathode. Illustrative examples of cathode materials generally comprise alkali metals, alkaline earth metals and transition metals such as, but not limited to, K, Li, Na, Rb, Mg, La, Ce, Ca, Sr, Ba, Al, Ag, In, Sn, Zn, Zr, or mixtures thereof. Other illustrative examples of cathode materials comprise alkali metal fluorides, or alkaline earth fluorides, or mixtures of fluorides. Other illustrative examples of cathode materials comprise a metal such as gold, indium, manganese, tin, lead, aluminum, silver, magnesium, or alloys thereof; particularly a magnesium/silver, magnesium/indium, calcium/aluminum or lithium/aluminum alloy. Alternatively, the cathode can be made of two layers to enhance electron injection. Illustrative examples include, but are not limited to, an inner layer of metal halide, such as either LiF or NaF, or metal oxide, such as CaO or $Al_2O_3$; followed by an outer layer of a conductor, such as aluminum or silver; or an inner layer of calcium followed by an outer layer of aluminum or silver. Suitable anode materials for opto-electroactive devices typically comprise those having a high work function value. Illustrative examples of anode materials include, but are not limited to, indium tin oxide (ITO), tin oxide, indium oxide, zinc oxide, indium zinc oxide, carbon nanotube, nickel, gold, and mixtures thereof.

The layer comprising a metallocene of the invention may be applied by any suitable conventional technique such as spin-casting, spraying, dip coating, draw bar coating, gravure coating, screen printing, silk screening, ink jet printing, air knife coating, reverse roll coating, vacuum deposition, metering, chemical treatment and the like. For convenience in obtaining thin layers, the said layers are often applied in the form of a dilute solution, with the solvent being removed after deposition of the coating by conventional techniques such as by vacuum, heating and the like.

In another embodiment a metallocene may be present in an opto-electroactive device in the form of a composite comprising at least one metallocene of the invention and at least one polymeric or non-polymeric conductor. There is no particular limitation on the polymeric or non-polymeric conductor provided that the composite is effective to provide at least one of a light-emitting layer, a light-absorbing layer, or a hole-blocking layer in an opto-electroactive device. Illustrative examples of suitable conducting polymers comprise poly(9-vinylcarbazole) and poly(phenylsilane). Illustrative examples of suitable non-polymeric conductors comprise aryl-substituted oxadiazoles, aryl-substituted triazoles, aryl-substituted phenanthrolines, benzoxazoles or benzthiazole compounds. In a particular embodiment a suitable non-polymeric conductor comprises 3-(4'-tert-butylphenyl)-4-phenyl-5-(4"-biphenyl)-1,2,4-triazole (TAZ). Additional, non-limiting examples of non-polymeric conductors are given in U.S. Pat. No. 6,645,645. The said composite may be formed by any convenient method. In some embodiments the composite may be formed by a method and at a temperature such that the metallocene remains present in the composite in a form suitable to provide a light-emitting layer, a light-absorbing layer, or a hole-blocking layer in an opto-electroactive device. In a particular embodiment the composite is formed from a solution of at least one metallocene of the invention and at least one polymeric or non-polymeric conductor. In another particular embodiment the composite is formed by spin-coating of a solution of at least one metallocene of the invention and at least one polymeric or non-polymeric conductor. In still another particular embodiment the composite is formed by vacuum co-evaporation of at least one metallocene of the invention and at least one polymeric or non-polymeric conductor.

The amount of metallocene present in said composite is typically an amount effective to provide a light-emitting layer, a light-absorbing layer, or a hole-blocking layer in an opto-electroactive device. In some embodiments the metallocene is present in the composite at a level of greater than about 50 wt. % based on the weight of metallocene and the polymeric or non-polymeric conductor. In still other embodiments the amount of polymer present in the composite is greater than or equal to that amount sufficient to provide a prefabricated film of the composite. Said film may be formed using conventional techniques such as, but not limited to, compression molding, film extrusion, solution casting and like methods. Said film may be employed in fabricating an opto-electroactive device using conventional techniques such as, but not limited to, lamination. In some embodiments two or more layers of the opto-electroactive device may be prepared in a separate step and combined before assembly of the final device. In still other embodiments the metallocene is a dispersed phase in the polymeric or non-polymeric matrix and is present in the composite at a level of less than about 50 wt. % and preferably less than about 30 wt. %, based on the weight of metallocene and matrix material.

Metallocenes of the present invention may be used in any opto-electroactive device in which a light-emitting layer, or a light-absorbing layer, or a hole blocking layer may be beneficially employed. In some embodiments the metallocene is employed in an electroluminescent device, an LED, an OLED, a photovoltaic device, a photoconductor, a photodetector, or in a chemical or biochemical sensor. Electroluminescent devices are used, for example, as self-illuminating display elements, such as control lamps, alphanumeric displays, signs, solid-state lighting, or in opto-electronic couplers and like applications.

Without further elaboration, it is believed that one skilled in the art can, using the description herein, utilize the present invention to its fullest extent. The following examples are included to provide additional guidance to those skilled in the art in practicing the claimed invention. The examples provided are merely representative of the work that contributes to the teaching of the present application. Accordingly, these examples are not intended to limit the invention, as defined in the appended claims, in any manner. In the following examples the abbreviation "Cp" is an unsubstituted cyclopentadienyl ring unless otherwise noted. CPZ12 is $(\eta^5\text{-}C_{12}H_{25}C_5H_4)_2ZrCl_2$ (bis-(dodecylcyclopentadienyl) zirconium dichloride). Zirconocenes and hafnocenes were obtained commercially or synthesized as described. All synthetic procedures were carried out under nitrogen using standard Schlenk technique.

EXAMPLE 1

General synthesis of $Cp*_2ZrBr_2$: To a solution (or a suspension, if the starting complex is not well soluble) of 1 gram (g) of $Cp*_2ZrCl_2$ (wherein $Cp*=C_5H_5$ or $Me_2Si(C_5H_4)_2$) in 60–70 milliliters (ml) absolute toluene 6 equivalents of $PBr_3$ were added. The mixture was stirred overnight at room temperature. No changes were observed for $Cp*=C_5H_5$. The initial solid disappeared and a light-green precipitate was formed in the case of $Cp*=Me_2Si(C_5H_4)_2$. The mixture was concentrated to about 15–20 ml and 80 ml of hexanes were added. After stirring the mixture for 15 minutes, crystalline precipitate was filtered off, washed with 20 ml of hexane and dried in vacuo for 2 hours to yield either $(C_5H_5)_2ZrBr_2$ as colorless crystals in 92% yield or $Me_2Si(C_5H_4)_2ZrBr_2$ as a light-green powder in 57% yield.

EXAMPLE 2

Synthesis of $Cp_2ZrBr_2$: $Cp_2ZrCl_2$ (2 g, 6.85 millimoles (mmol)) was dissolved in 30 ml chloroform. Boron tribromide (2.1 g, 8 mmol) was added slowly under nitrogen. The mixture was subjected to ambient distillation and then vacuum distillation to leave 2.3 g of off-white powder (88% yield).

Cyclic voltammetry measurements for metallocenes were performed in acetonitrile with 0.1M tetrabutylammonium perchlorate electrolyte. A 3-electrode set-up was used with a glassy carbon working electrode, platinum counter electrode and silver/silver nitrate reference electrode and a sweep rate of 0.5 volts per second (V/s). FIG. 1 shows cyclic voltammetry measurements for $Cp_2ZrCl_2$. Apparently reversible waves were noted with Eo=1.72 V and peak to peak separation=140 millivolts (mV). Table 1 shows the characteristics for some metallocenes of the invention. HOMO (highest occupied molecular orbital) values were determined by cyclic voltammetry. Photoluminescence quantum yields (PL QY) were determined as follows. Five replicate measurements were made for solid metallocenes using a standard protocol on a Spex Fluorolog 2 instrument. Barium magnesium aluminate doped with Eu was used as a quantum efficiency standard, and barium sulfate was used as the reflectance standard. Measurements were made at 370 nm excitation. Microsecond time resolved decay time data were acquired using an Edinburgh Instruments FLS900 fluorimeter equipped with a microsecond flashlamp whose output was directed into a 0.25 meter monochromator before being focused onto the sample. The monochromator was set so that the center excitation wavelength was 350 nm and the spectral width was less than 10 nm. The powder sample was mounted on a quartz slide using an optically inert silicone as a supporting matrix. The emission was detected at 90 degrees relative to the excitation using a monochrometer (460 nm center, less than 10 nm spectral width) and a sidearm photomultiplier tube connected to a constant fraction discriminator and time binning electronics. The width of each time bin was 1 microsecond. The decay time values in Table 1 indicate that certain of these compounds are phosphorescent materials.

TABLE 1

| Metallocene | HOMO (eV) | PL QY (%) | Decay, microsec. | Lambda max, nm |
|---|---|---|---|---|
| $Cp_2ZrCl_2$ | −6.93 | 50 | 14 | 438 |
| $Me_2Si(Cp)_2ZrCl_2$ | −6.78 | 68 | 28 | 470 |
| $Cp_2ZrBr_2$ | −6.58 | 40 | — | 448 |
| $Me_2Si(Cp)_2ZrBr_2$ | −6.50 | 64 | — | 489 |
| $Cp_2HfCl_2$ | <−7.1 | 44 | 41 | 436 |

EXAMPLE 3

To measure electroluminescent properties, a device of the general structure ITO/PEDT:PSS/NPD/CPZ/BCP/LiF/Al was made. For comparison a device of the general structure ITO/PEDT:PSS/NPD/ALQ/LiF/Al was also made. Indium-Tin-Oxide (ITO) films on glass were obtained from a subsidiary of Applied Films (Colorado Concept Coatings LLC) and patterned by photolithography. The ITO film thickness was about 1500 angstroms. After the ITO was solvent cleaned and subjected to a 10 minute UV/ozone treatment, the conductive polymer poly(3,4-ethylenedioxythiophene)/poly(styrenesulfonate) (PEDT:PSS) (Baytron P VP CH 8000) was spun-cast from aqueous dispersion onto the ITO film and then the assembly was baked for one hour at about 180° C. Each device was treated in a vacuum deposition chamber located inside an argon-filled glove box, wherein a layer of NPD (N,N'-di-[(1-naphthalenyl)-N,N'-diphenyl]-1,1'-biphenyl)-4,4'-diamine) about 500 angstroms thick was evaporated onto each device. In the device which is an example of the invention (referred to herein after as "CPZ device") a layer of $Cp_2ZrCl_2$ (CPZ) about 200 angstroms thick was evaporated onto the NPD layer. Following deposition of the CPZ layer in the device of the invention, a layer of bathocuproine (BCP; 2,9-dimethyl-4,7-diphenyl-1,10-phenanthroline) about 80–100 angstroms thick was deposited on top of the CPZ layer. In the comparative device a layer of ALQ (aluminum tris(8-hydroxyquinoline)) about 200 angstroms thick was deposited on top of the NPD layer. Each device was removed from the vacuum deposition chamber, equipped with a shadow mask and returned to the vacuum deposition chamber. A 0.5 nm thick film of lithium fluoride (LiF), followed by a film of aluminum (Al) about 100 nm thick were deposited through the shadow mask onto each device at a base pressure of about $2 \times 10^{-6}$ torr. The devices were encapsulated with a cover glass and an edge seal using a UV-curable adhesive.

Figure 2:
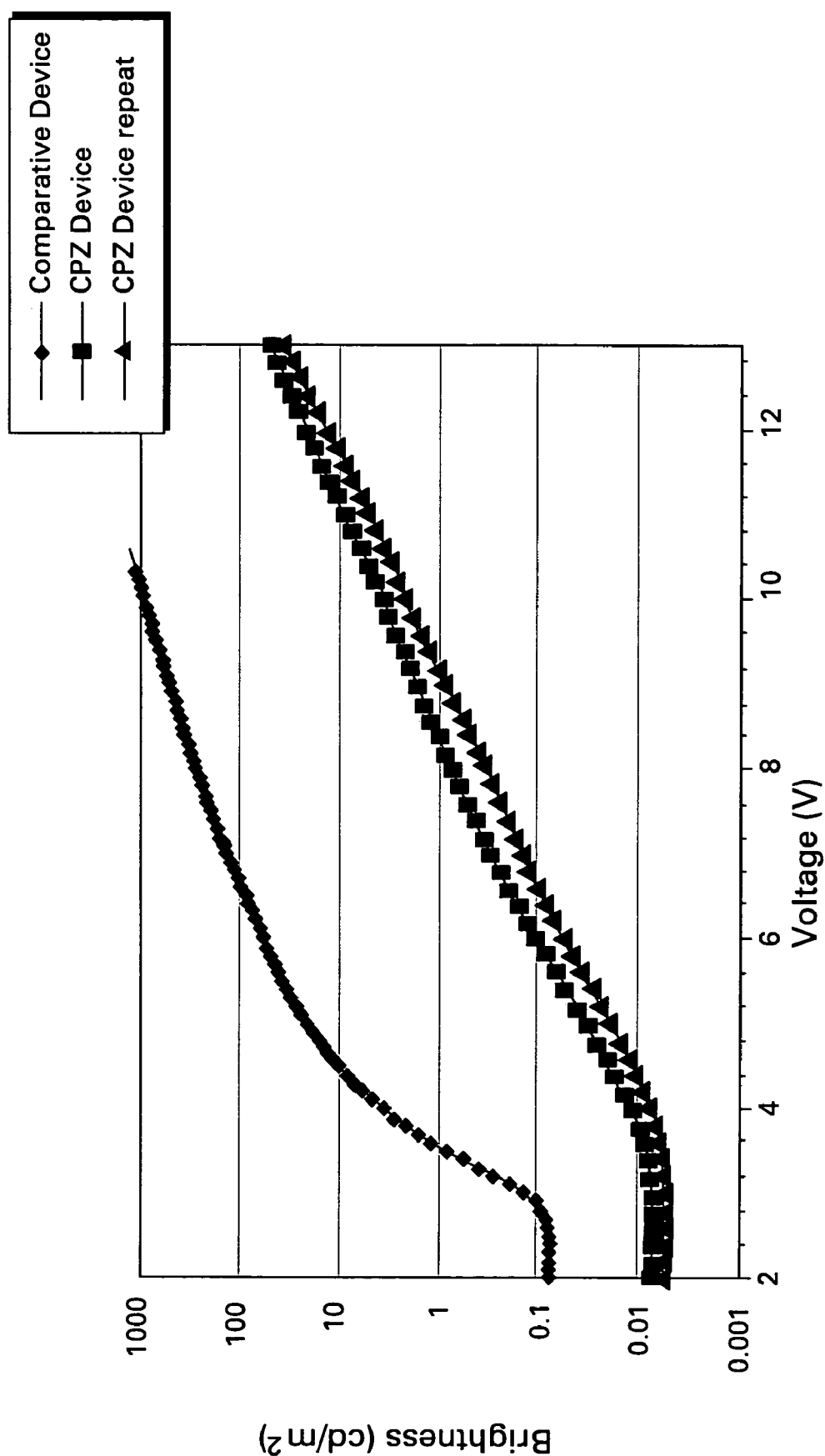
FIG. 2 shows brightness in candellas per square meter versus voltage measured for two opto-electroactive devices comprising $Cp_2ZrCl_2$ and for a comparative opto-electroactive device without zirconocene.
Figure 3:
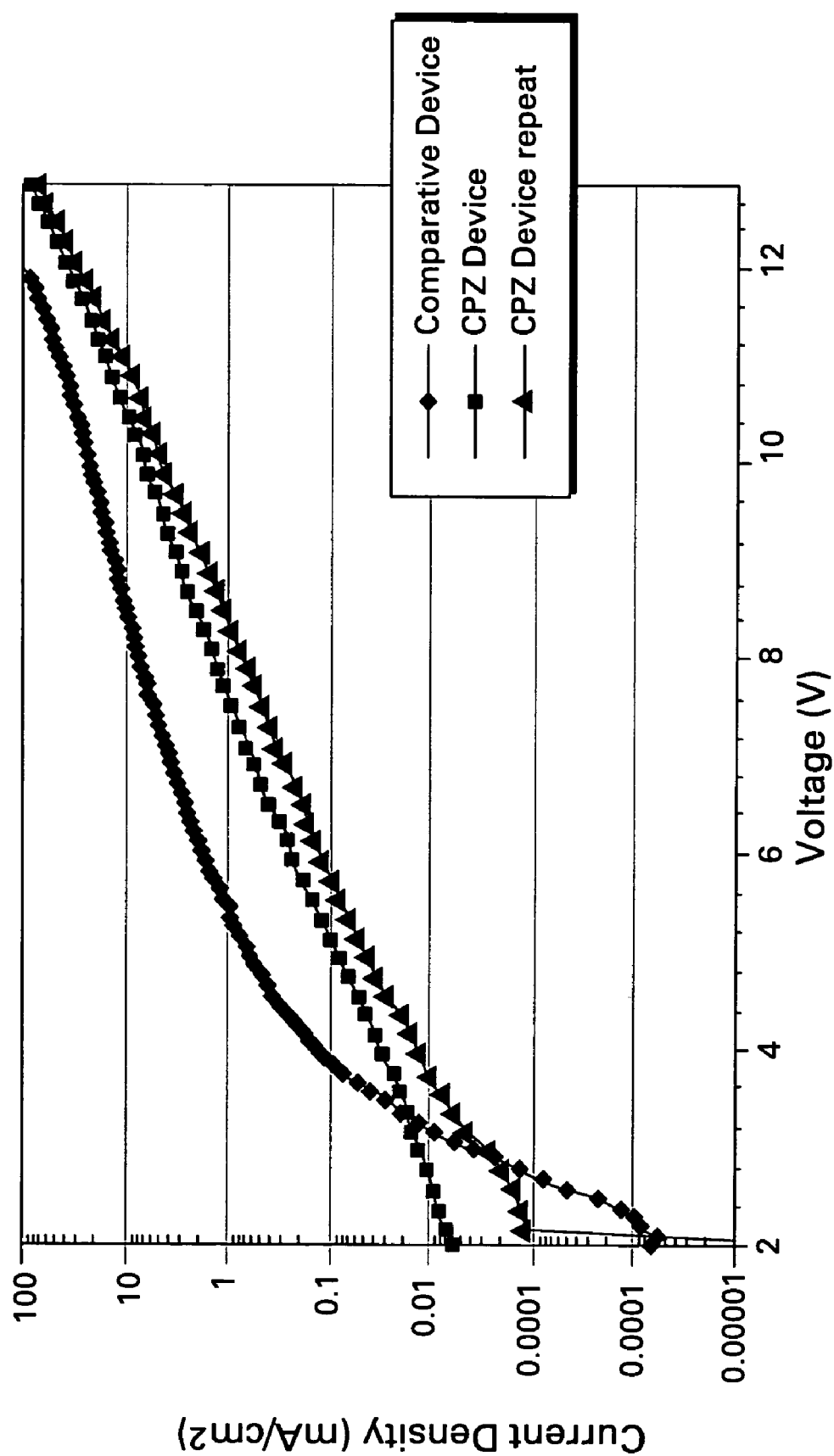
FIG. 3 shows current as milliamperes (mA) per square centimeter ($cm^2$) versus voltage measured for two opto-electroactive devices comprising $Cp_2ZrCl_2$ and for a comparative opto-electroactive device without zirconocene.
Figure 4:
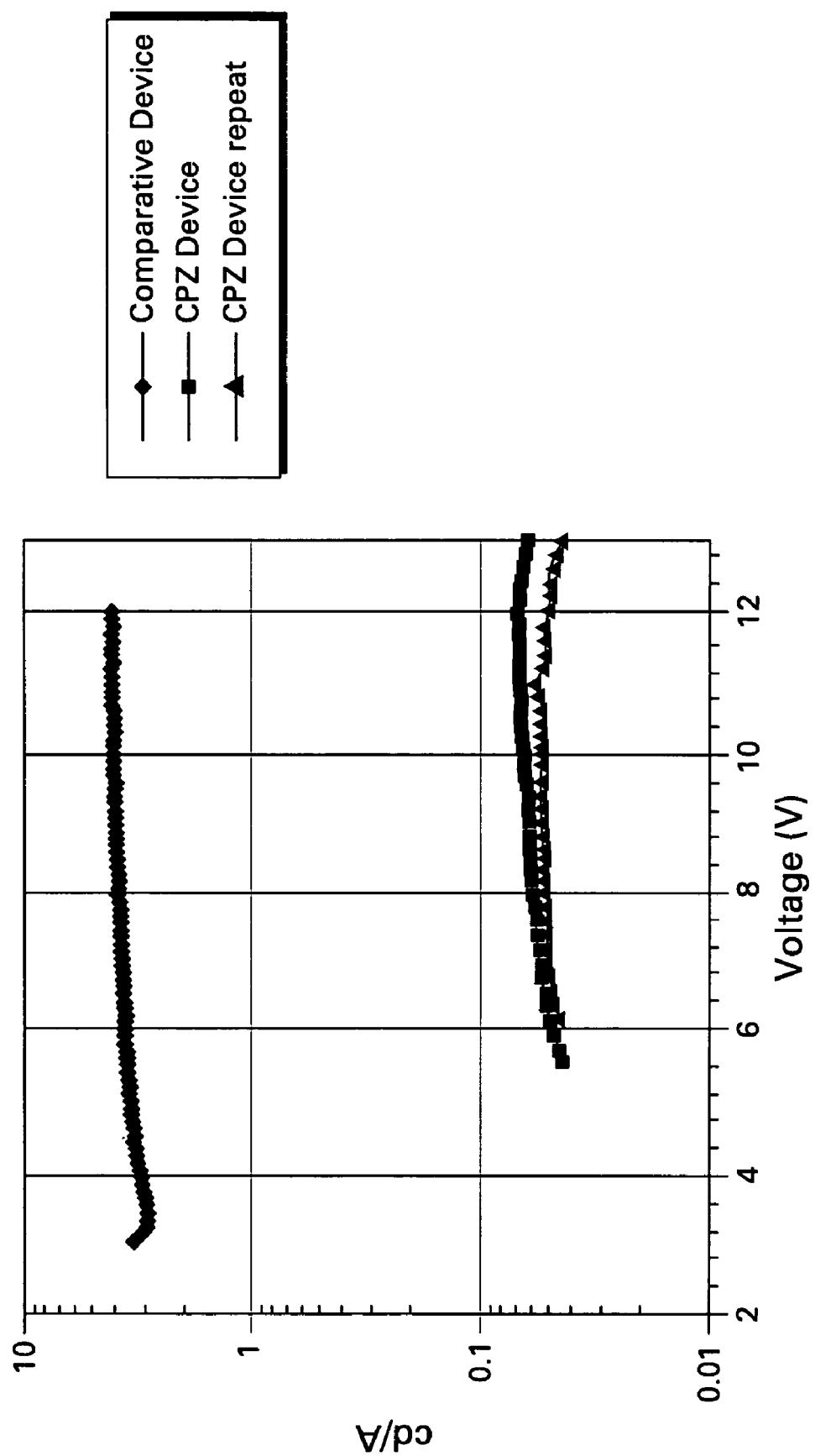
FIG. 4 shows the electroluminescence efficiency in candellas per ampere versus voltage measured for two opto-electroactive devices comprising $Cp_2ZrCl_2$ and for a comparative opto-electroactive device without zirconocene.
Figure 5:
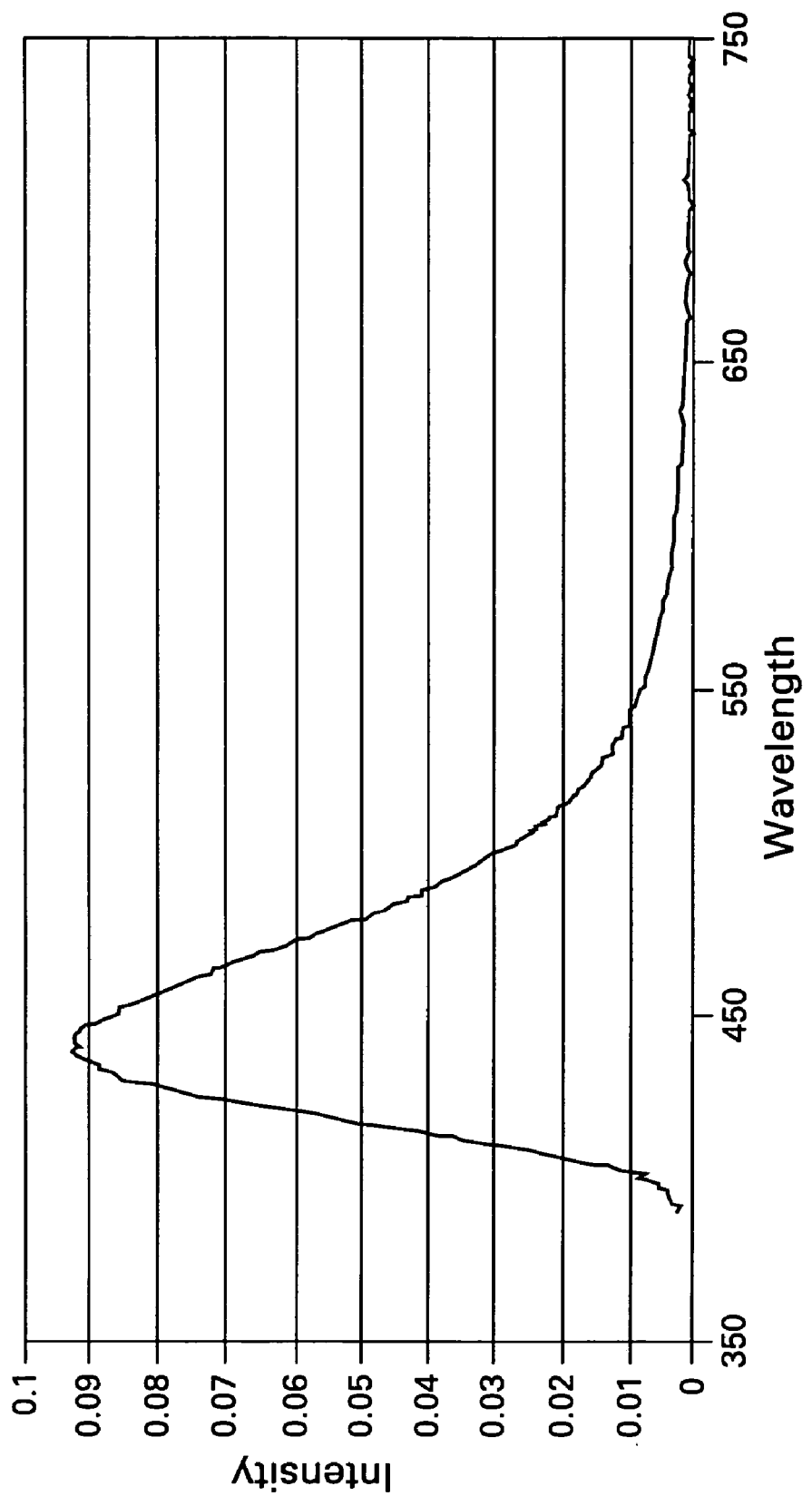
FIG. 5 shows the electroluminescence spectrum for an opto-electroactive device comprising $Cp_2ZrCl_2$.

The current and brightness of the devices were measured versus voltage with a Keithley sourcemeter and a calibrated photodiode, respectively, using standard measurement protocols. FIG. 2 shows brightness in candellas per square meter versus voltage measured for the CPZ device and for the comparative opto-electroactive device without zirconocene. FIG. 3 shows current as milliamperes (mA) per square centimeter ($cm^2$) versus voltage measured for the CPZ device and for the comparative opto-electroactive device without zirconocene. In each of FIGS. 2 and 3 data are shown for two separate CPZ devices. FIG. 4 shows the electroluminescence (EL) efficiency in candellas per ampere versus voltage measured for the CPZ device and for the comparative opto-electroactive device without zirconocene. Although lower in EL efficiency than the comparative device, the CPZ-comprising device is unoptimized and demonstrates that a metallocene-comprising device is feasible. FIG. 5 shows the normalized EL spectrum for the CPZ device, indicating the color of emission.

EXAMPLE 4

Figure 6:
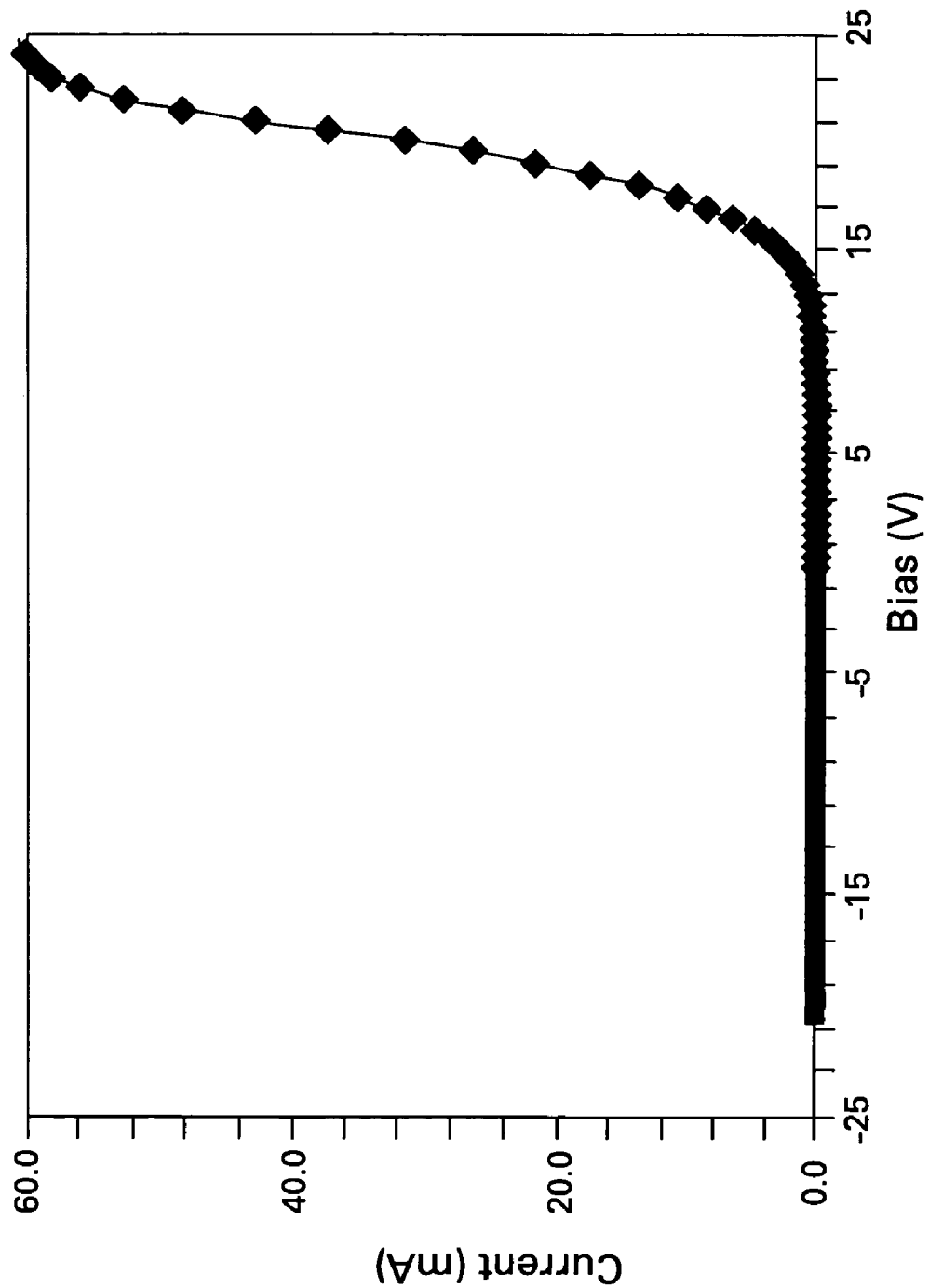
FIG. 6 shows a plot of current as milliamperes (mA) versus voltage for an opto-electroactive device comprising $Cp_2ZrCl_2$ in a matrix of poly(9-vinylcarbazole).

An opto-electroactive device was prepared with layers comprising ITO/PEDT:PSS/(CPZ-PVK)/NaF/Al. The CPZ-PVK layer was formed by spin-coating of a solution comprising 2% by weight poly(9-vinylcarbazole) (PVK) in xylene comprising 0.3 wt. % CPZ present with respect to PVK. FIG. 6 shows a plot of current as milliamperes (mA) versus voltage measured for this device.

EXAMPLE 5

Figure 7:
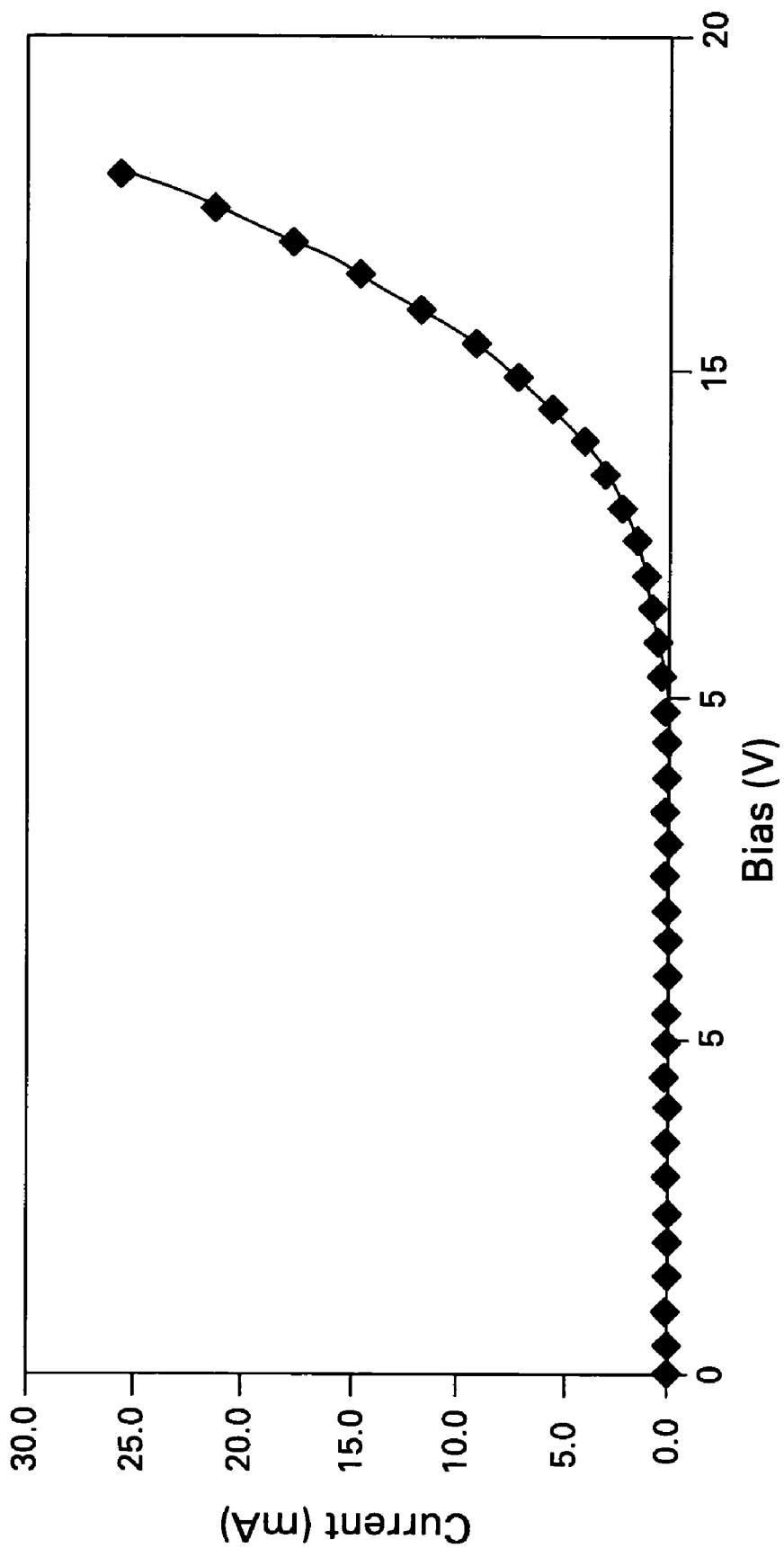
FIG. 7 shows a plot of current as milliamperes (mA) versus voltage for an opto-electroactive device comprising $(\eta^5\text{-}C_{12}H_{25}C_5H_4)_2ZrCl_2$ in a matrix of poly(phenylsilane).

An opto-electroactive device was prepared with layers comprising ITO/PEDT:PSS/(CPZ12-PPS)/NaF/Al. The CPZ12-PPS layer was formed by spin-coating of a solution comprising 2% by weight poly(phenylsilane) (PPS) in xylene comprising 2 wt. % CPZ12 present with respect to PPS. FIG. 7 shows a plot of current as milliamperes (mA) versus voltage measured for this device.

While the invention has been illustrated and described in typical embodiments, it is not intended to be limited to the details shown, since various modifications and substitutions can be made without departing in any way from the spirit of the present invention. As such, further modifications and equivalents of the invention herein disclosed may occur to persons skilled in the art using no more than routine experimentation, and all such modifications and equivalents are believed to be within the spirit and scope of the invention as defined by the following claims. All patents and published articles cited herein are incorporated herein by reference.

What is claimed is:

1. An opto-electroactive device comprising
an anode;
a cathode; and
a layer comprising a metallocene of the formula

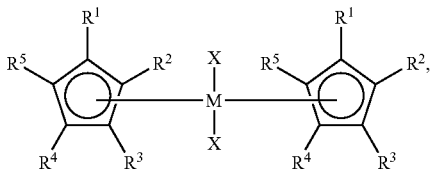

wherein M is zirconium or hafnium; X is halogen and $R^1$–$R^5$ are each independently hydrogen, aryl, alkyl, halogen or —Si($R^6$)$_3$; or wherein at least two adjacent R substituents on at least one ring are joined to form a fused ring, which may be unsubstituted or substituted with aryl, alkyl, halogen or —Si($R^6$)$_3$; or wherein the $R^1$ substituents on each ring are joined via a bridging ansa group, and
wherein $R^6$ is an alkyl group, a substituted alkyl group, an aryl or a substituted aryl group.

2. The opto-electroactive device of claim 1, wherein X is fluoro, chloro or bromo, and $R^1$–$R^5$ are each hydrogen.

3. The opto-electroactive device of claim 1, wherein X is fluoro, chloro or bromo, and the $R^1$ substituents on each ring are joined to link the rings via a bridging ansa group, wherein the bridging ansa group is -E($R^6$)$_2$ wherein E is carbon, silicon, or germanium, and $R^6$ is selected from the group consisting of alkyl, substituted alkyl, methyl, aryl and substituted aryl.

4. The opto-electroactive device of claim 3, wherein X is chloro and E is silicon.

5. The opto-electroactive device of claim 1, which comprises a zirconocene.

6. The opto-electroactive device of claim 5, wherein the zirconocene has a HOMO value of less than or equal to minus 6 electron volts.

7. The opto-electroactive device of claim 5, wherein the zirconocene is phosphorescent.

8. The opto-electroactive device of claim 1, which comprises a hafnocene.

9. The opto-electroactive device of claim 1, which is an electroluminescent device, an LED, an OLED, a photovoltaic device, a photoconductor, a photodetector, or in a chemical or biochemical sensor.

10. The opto-electroactive device of claim 1, wherein the metallocene is present in a light-emitting layer and the device emits light in the wavelength range of about 300 nm to about 1200 nm; or wherein the metallocene is present in a hole-blocking layer.

11. The opto-electroactive device of claim 1, wherein the metallocene is present in a light-absorbing layer and the device absorbs light in the wavelength range of about 300 nm to about 1200 nm.

12. The opto-electroactive device of claim 1, wherein the metallocene is present in the form of a composite comprising at least one metallocene and at least one polymeric or non-polymeric conductor.

13. The opto-electroactive device of claim 12, wherein the polymeric conductor comprises at least one of poly(9-vinylcarbazole) or poly(phenylsilane).

14. The opto-electroactive device of claim 12, wherein the non-polymeric conductor at least one of an aryl-substituted oxadiazole, an aryl-substituted phenanthroline, a benzoxazole, a benzthiazole, an aryl-substituted triazole, or 3-(4'-tert-butylphenyl)-4-phenyl-5-(4'-biphenyl)-1,2,4-triazole.

15. An opto-electroactive device comprising: (a) an anode; (b) a cathode; and (c) a layer comprising a zirconocene of the formula

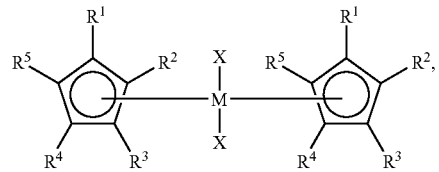

wherein X is halogen and $R^1$–$R^5$ are each independently hydrogen, aryl, alkyl, halogen or —Si($R^6$)$_3$; or wherein at least two adjacent R substituents on at least one ring are joined to form a fused ring, which may be unsubstituted or substituted with aryl, alkyl, halogen or —Si($R^6$)$_3$ wherein $R^6$ is an alkyl group, a substituted alkyl group, an aryl group or a substituted aryl group; or wherein the $R^1$ substituents on each ring are joined to link the rings via a bridging ansa group; and
wherein the layer (c) is a light-emitting layer and the device emits light in the wavelength range of about 300 nm to about 1200 nm; or wherein the layer (c) is a light-absorbing layer and the device absorbs light in the wavelength range of about 300 nm to about 1200 nm; or wherein the layer (c) is a hole-blocking layer.

16. The opto-electroactive device of claim 15, wherein X is fluoro, chloro or bromo, and $R^1$–$R^5$ are each hydrogen.

17. The opto-electroactive device of claim 15, wherein X is fluoro, chloro or bromo, and the $R^1$ substituents on each ring are joined to link the rings via a bridging ansa group, wherein the bridging ansa group is —Si($R^6$)$_2$ wherein $R^6$ is selected from the group consisting of alkyl, substituted alkyl, methyl, aryl and substituted aryl.

18. The opto-electroactive device of claim 15, which is an electroluminescent device, an LED, an OLED, a photovoltaic device, a photoconductor, a photodetector, or in a chemical or biochemical sensor.

19. The opto-electroactive device of claim 15, wherein the zirconocene is phosphorescent.

20. The opto-electroactive device of claim 15, wherein the zirconocene is present in the form of a composite comprising at least one zirconocene and at least one polymeric or non-polymeric conductor.

21. The opto-electroactive device of claim 20, wherein the polymeric conductor comprises at least one of poly(9-vinylcarbazole) or poly(phenylsilane).

22. The opto-electroactive device of claim 20, wherein the non-polymeric conductor comprises at least one of an aryl-substituted oxadiazole, an aryl-substituted phenanthroline, a benzoxazole, a benzthiazole, an aryl-substituted triazole, or 3-(4'-tert-butylphenyl)-4-phenyl-5-(4"-biphenyl)-1,2,4-triazole.

23. A method for making an opto-electroactive device comprising a zirconocene of claim 1, which comprises the step of applying the metallocene by vacuum deposition or from solution.

24. A method for making an opto-electroactive device comprising a zirconocene of claim 15, which comprises the step of applying the zirconocene by vacuum deposition or from solution.

* * * * *